(12) United States Patent
Alon et al.

(10) Patent No.: US 9,989,422 B2
(45) Date of Patent: Jun. 5, 2018

(54) SYSTEM, METHOD AND COMPUTER ACCESSIBLE MEDIUM FOR DETERMINING TISSUE THERMAL PROPERTY

(71) Applicants: Leeor Alon, New York, NY (US); Daniel K. Sodickson, Larchmont, NY (US)

(72) Inventors: Leeor Alon, New York, NY (US); Daniel K. Sodickson, Larchmont, NY (US)

(73) Assignee: New York University, New York, NY (US)

(*) Notice: Subject to any disclaimer, the term of this patent is extended or adjusted under 35 U.S.C. 154(b) by 1023 days.

(21) Appl. No.: 14/246,647

(22) Filed: Apr. 7, 2014

(65) Prior Publication Data

US 2014/0303927 A1    Oct. 9, 2014

Related U.S. Application Data

(60) Provisional application No. 61/808,869, filed on Apr. 5, 2013.

(51) Int. Cl.
| | |
|---|---|
| G01K 13/00 | (2006.01) |
| G01K 7/36 | (2006.01) |
| G01R 33/48 | (2006.01) |
| G06F 11/30 | (2006.01) |

(52) U.S. Cl.
CPC ............ G01K 7/36 (2013.01); G01R 33/4804 (2013.01); *G01K 2213/00* (2013.01)

(58) Field of Classification Search
CPC ...................................................... G01K 7/36
See application file for complete search history.

(56) References Cited

PUBLICATIONS

Collins, C.M. et al., Temperature and SAR Calculations for a Human Head Within Volume and Surface Coils at 64 and 300 MHz JMRU, vol. 19, pp. 650-656.*
Pennes, H.H., "Analysis of Tissue and Arterial Blood Temperatures in the Resting Human Forearm" Journal Applied Physiology, pp. 93-122 (1948).
Katchser, U. et al., "An In Vivo Study on Fast PRF Temperature Imaging based on . . . Alternative Approach to Monitor" IEEE Trans Med Imaging 2003, vol. 28, p. 1365 (2009).
Sodickson, D.K. et al, "Generalized Local Maxwell Tomography for Mapping of Electrical Property Gradients and Tensors" ISMRM, p. 387 (2012).
Cao, Z. et al., "Determination of Electric Conductivity and Local SAR via B1 Mapping" ISMRM, p. 312 (2012).
Collins, C.M. et al., Temperature adn SAR Calculations for a Human Head Within Volume and Surface Coils at 64 and 300 MHz JMRU, Colume, 19 pp. 650-656 (2004).

* cited by examiner

*Primary Examiner* — Phuong Huynh
(74) *Attorney, Agent, or Firm* — Hunton Andrews Kurth LLP (57) ABSTRACT

An exemplary system, method and computer-accessible medium for constructing information regarding a distribution of thermal properties of an object(s), can be provided. For example, data related to a temperature of the object(s) can be received at multiple points in time and space at which a portion(s) of the object(s) is heated or cooled. The information can be constructed using the data based on a bio-heat equation.

20 Claims, 5 Drawing Sheets

SYSTEM, METHOD AND COMPUTER ACCESSIBLE MEDIUM FOR DETERMINING TISSUE THERMAL PROPERTY

CROSS-REFERENCE TO RELATED APPLICATIONS

This application relates to and claims priority from U.S. Patent Application No. 61/808,869, filed on Apr. 5, 2013, the entire disclosure of which is incorporated herein by reference.

FIELD OF THE DISCLOSURE

The present disclosure relates generally to magnetic resonance imaging ("MRI"), and more specifically, to exemplary embodiments of systems, methods and computer-accessible mediums for construe ting information regarding a distribution of thermal properties of tissue.

BACKGROUND INFORMATION

Magnetic resonance ("MR")-based methods have been used which map the electrical property distribution of tissues inside the body. (See e.g., References 1 and 2). These methods can utilize cross-sectional measurements of magnetic fields, perturbed by the presence of the body, to deduce the spatial distribution of electrical conductivity and permittivity responsible for such perturbations. One previously-known method, Local Maxwell Tomography ("LMT") (see e.g., References 2), in particular, can use measurements of field curvature in distinct MR transmit and receive coils to solve for coil-independent tissue and field related unknowns based on a self-consistent set of equations. However, such method cannot determine a distribution of thermal properties of an object.

Thus, it may be beneficial to provide exemplary systems, methods and computer accessible mediums that can construct a distribution of the thermal properties of an object, such as an anatomical structure, from MR thermometry and which can overcome at least some of the deficiencies described herein above.

SUMMARY OF EXEMPLARY EMBODIMENTS

An exemplary system, method and computer-accessible medium for constructing information regarding a distribution of thermal properties of an object(s), can be provided. For example, data related to a temperature of the object(s) can be received at multiple points in time and space at which a portion(s) of the object(s) can be heated or cooled. The information can be constructed based on a bio-heat, equation, which can be a Pennes' bio-heat equation.

The temperature data can be generated using magnetic resonance thermometry or positron emission tomography, and the temperature data can include information about a pixel or a voxel associated with an image of the object(s). The construction of the information can be performed by inverting the Pennes' bio-heat equation. In certain exemplary embodiments of the present disclosure, the data can be based on progressive temperature measurements of the portion(s) of the object(s). The construction can be performed by measuring spatial and temporal variations in the temperature measurement as the object(s) is heated or cooled.

In some exemplary embodiments of the present disclosure, the construction of the information can be performed by discrediting the bio-heat equation in a matrix form, where rows or columns of the matrix can correspond to different acquisition times of the spatial variations of the temperature data. The matrix can have a form of, for example:

$$\begin{bmatrix} T_2 - T_1 \\ \vdots \\ T_n - T_{n-1} \end{bmatrix} = \begin{bmatrix} \nabla^2 T_1 dt & \rho_{blood} c_{blood} (T_1 - T_{core}) dt & dt \\ \vdots & \vdots & \vdots \\ \nabla^2 T_{n-1} dt & \rho_{blood} c_{blood} (T_{n-1} - T_{core}) dt & dt \end{bmatrix} \begin{bmatrix} \frac{k}{\rho c} \\ \frac{w}{\rho c} \\ \frac{Q_m}{\rho c} \end{bmatrix}.$$

According to further certain exemplary embodiments of the present disclosure, the information can relate to a perfusion of the object(s), which can be based on $$\frac{k}{cp}.$$

The information can relate to a metabolic energy of the object(s), which can be based on $$\frac{w}{cp}.$$

The information can also relate to a heat diffusivity of the object(s), which can be based on $$\frac{Q}{cp}.$$

The object(s) can include an anatomical structure, and the anatomical structure can be fat, muscle, or cerebellum.

In still further exemplary embodiments of the present disclosure, the information can be two-dimensional information, three-dimensional information, or four-dimensional information. The information can relate to (i) a time invariant perfusion, (ii) a time invariant metabolic energy, or (iii) a time invariant heat diffusivity.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures, or the appended claims.

DETAILED DESCRIPTION OF EXEMPLARY EMBODIMENTS

An exemplary system, method, and computer-accessible medium, according to an exemplary embodiment of the present disclosure, can be provided to construct and/or reconstruct a distribution of thermal properties of a body from MR thermometry, from positron emission tomography, or other suitable imaging mechanism, at multiple time points. Cross-sectional measurements (e.g., temperature measurements) of magnetic fields perturbed by the presence of the body can be used to determine the spatial distribution of electrical conductivity and permittivity responsible for such perturbations. The exemplary system, method, and computer-accessible medium, according to an exemplary embodiment of the present disclosure, can solve the Pennes' bio-heat equation (See e.g., Reference 3), or other equation (e.g., a bio-heat equation, a heat transfer equation, a heat transport equation, a heat equation, or a further bio-heat equation) to determine temperature measurements at distinct time points during the body's heating and/or cooling. Thermal properties of a body, which can be based on spatial and temporal data at multiple points, can be constructed and/or reconstructed by heating an object (e.g., plasma) and measuring spatial and temporal variations in temperature distribution using MR thermometry as the exemplary object cools down. The thermal properties of the body can also be constructed and/or reconstructed by measuring spatial and temporal variations in temperature distribution using MR thermometry as the exemplary object is heated.

Exemplary Explanation

Pennes bio-heat equation (See e.g., Reference 3) can relate temperature change to perfusion, diffusion, heat capacity and metabolic energy, and can be written, for example, as follows, in the absence of an external source of heating:

$$\rho c \frac{dT}{dt} = k\nabla^2 T - \rho_{blood}^{wc_{blood}} (T - T_{core}) + Q_m \quad (1)$$

where, $\rho$ can be the density of tissue in $kg/m^3$, c can be the specific heat capacity in $J/kg/C$, k can be the thermal conductivity in $W/m/C$, T can be temperature, t can be time, w can be perfusion in $mL/100\ g/min$ and $Q_m$ can be the metabolic energy generated by the body, for example in $$\frac{W}{m^3}.$$

Equation 1 above can be discretized in space and in time (see e.g., reference 4), which can yield the following exemplary matrix equation, in which each row can correspond to a different acquisition time during cooling:

$$\begin{bmatrix} T_2 & \cdots & T_1 \\ & \vdots & \\ T_n & \cdots & T_{n-1} \end{bmatrix} = \begin{bmatrix} \nabla^2 T_1 dt & \rho_{blood}c_{blood}(T_1 - T_{core})dt & dt \\ \vdots & \vdots & \vdots \\ \nabla^2 T_{n-1} dt & \rho_{blood}c_{blood}(T_{n-1} - T_{core})dt & dt \end{bmatrix} \begin{bmatrix} \frac{k}{\rho c} \\ \frac{w}{\rho c} \\ \frac{Q_m}{\rho c} \end{bmatrix} \quad (2)$$

This exemplary formalism can utilize the fact that heat diffusion, perfusion, and metabolic heat terms can be a time invariant. The linear system of equations can have a solution using matrix inversion, which can yield estimates of the heat diffusivity $$\frac{k}{\rho c}$$

and the quantities $$\frac{w}{\rho c} \text{ and } \frac{Q_m}{\rho c}.$$

Exemplary Methods and Results

Figure 1A:
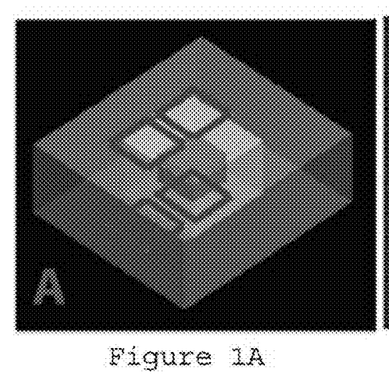
FIG. 1A is an exemplary image of an exemplary simulation setup with four surface coils according to an exemplary embodiment of the present disclosure.
Figure 1B:
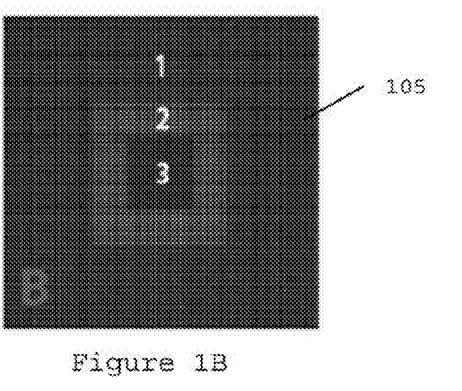
FIG. 1B is an exemplary image of an exemplary central coronal slice along a phantom according to an exemplary embodiment of the present disclosure.
Figure 1C:
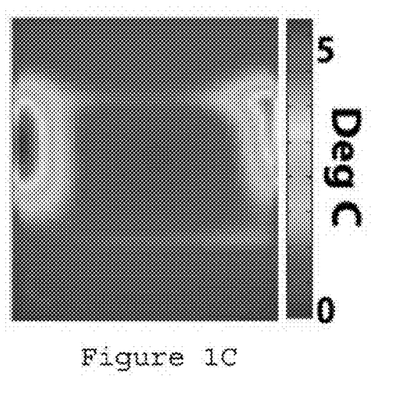
FIG. 1C is an exemplary image of an exemplary temperature change map after radio frequency heating according to an exemplary embodiment of the present disclosure.
Figure 2:
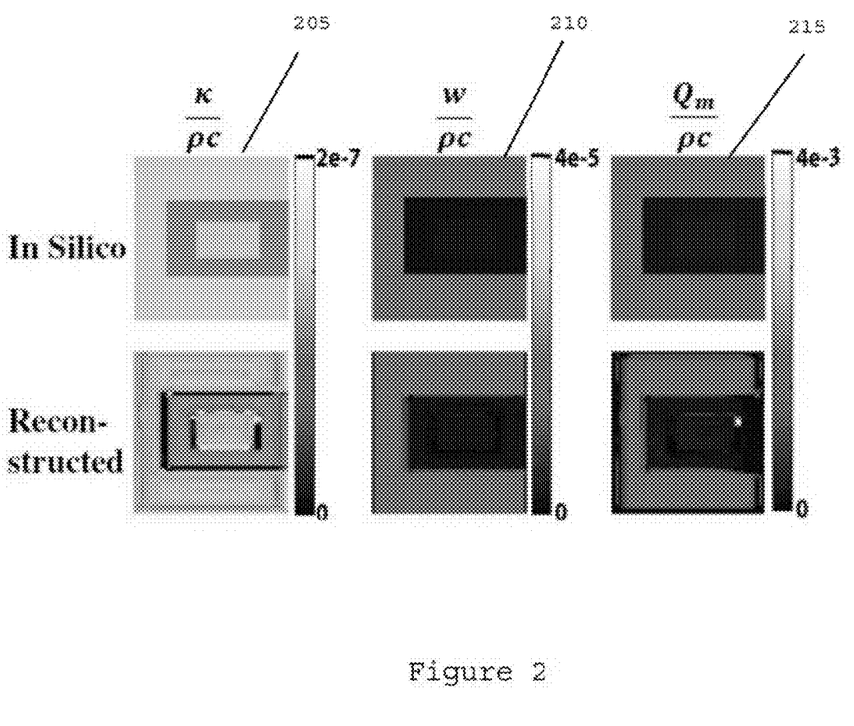
FIG. 2 is a diagram illustrating exemplary true and reconstructed thermal properties in an axial slice through a phantom according to an exemplary embodiment of the present disclosure.

The exemplary system, method, and computer-accessible medium according to an exemplary embodiment of the present disclosure can utilize an exemplary four channel transmit coil provided around an exemplary phantom with 3 different tissue compartments (e.g., cerebellum, fat and muscle), which can be modeled (see e.g., FIGS. 1A and 1B) using commercial finite difference time-domain ("FDTD") software (e.g., xFDTD, Remcom, Pa., USA). The voxel size can be set to about $2.5 \times 2.5 \times 2.5\ mm^3$ and a unit current source can be used to drive each of the coils at a frequency of about 100 MHz. The ex-vivo thermal properties of cerebellum, fat, and muscle are detailed in Table 1 below. Area 105 of FIG. 1B illustrates the properties targeted for reconstruction using the exemplary system, method, and computer-accessible medium. A radio frequency ("RF") drive can be played out continuously for about 200 seconds, which can induce a temperature change, as shown in an exemplary image of FIG. 1C for a coronal slice in the center of the exemplary phantom. The exemplary temperature change due to the RF drive can be calculated using a discrete version of the bio heat equation where the time step size (dt) can be set to 2 seconds. After heating, the phantom can be allowed to cool down for about 2000 seconds, and at intervals of about 20 seconds, a temperature snapshot can be taken. A comparison of true and reconstructed thermal properties is shown in FIG. 2, which illustrates how the thermal conductivity over density and heat capacity (element 205), perfusion over density and heat capacity (element 210), and metabolic energy over heat capacity (element 215) were reconstructed using the spatial and temporal temperature information. The exemplary reconstructed values can be distinct among different tissue types and, as shown in FIG. 2, can agree with the reported values that were a-priori defined in-silico. In this figure, the thermal conductivity over density and heat capacity, perfusion over density and heat capacity and metabolic energy over heat capacity were reconstructed using the spatial and temporal temperature information. These reconstructed values can be distinct among different tissue types and are shown to agree with the reported values that were a-priori defined ("In silico).

TABLE 1

Heat related tissue properties measured from ex-vivo measurement used for the simulated phantom.

| | $\rho$ (kg/m$^2$) | C (j/kg/C) | $\kappa$ (W/m/C) | w (mL/100 g/ min) | $Q_m$ W/m$^3$ | $\frac{\kappa}{\rho c}$ (m$^2$/s) | $\frac{w}{\rho c}$ (mL·m$^3$·C)/ (100 g·min·J) | $\frac{Q_m}{\rho c}$ (C/s) |
|---|---|---|---|---|---|---|---|---|
| Cerebellum | 1035.5 | 3640 | 0.53 | 56 | 331 | 1.42e−07 | 1.49e−5 | 8.78e−5 |
| Fat | 94.3 | 2300 | 0.23 | 2.8 | 302 | 1.06e−07 | 1.29e−6 | 1.39e−4 |
| Muscle | 1059 | 3500 | 0.5 | 5 | 758 | 1.34e−07 | 1.35e−6 | 2.0e−4 |

Figure 3:
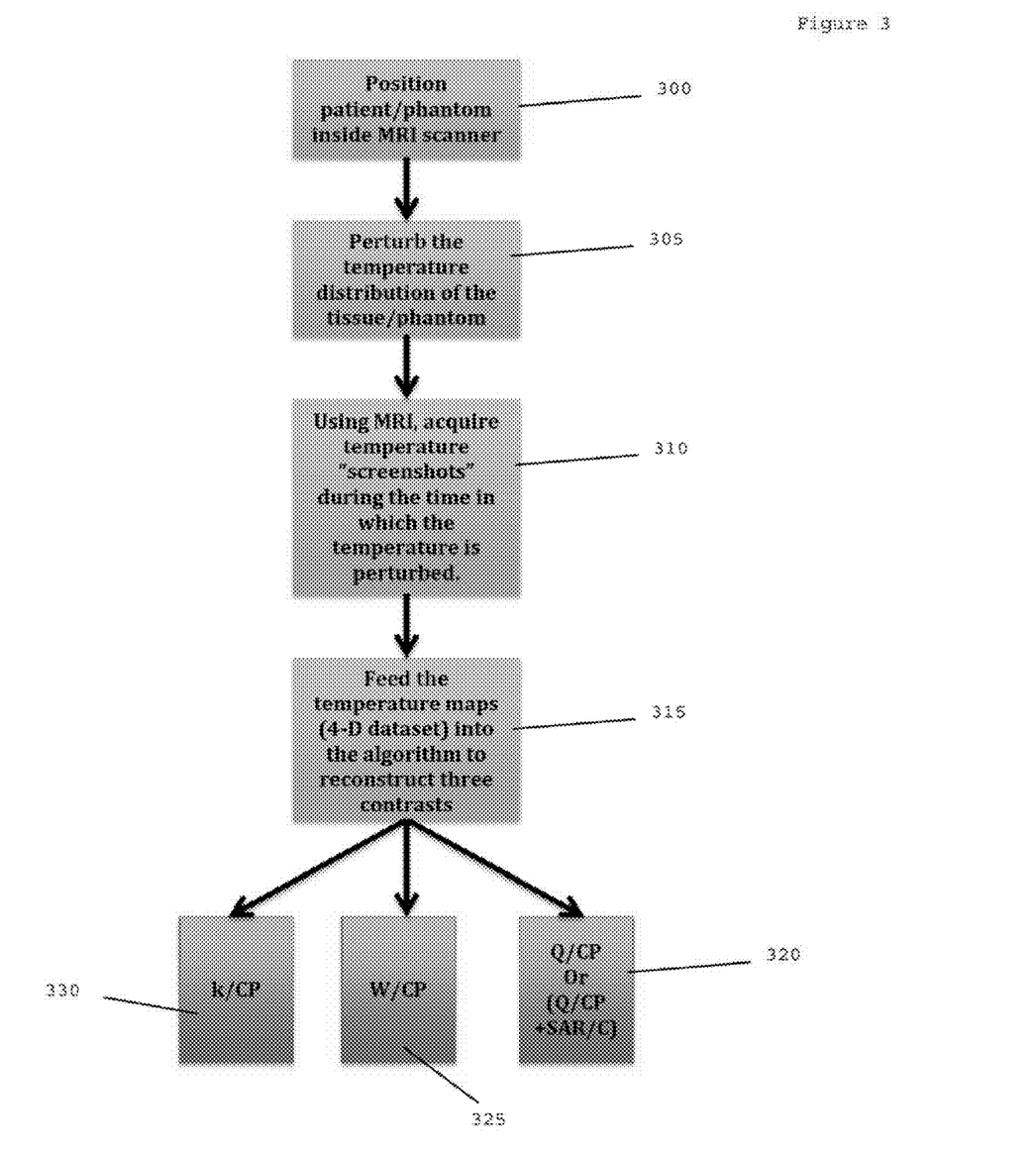
FIG. 3 is an exemplary flow diagram illustrating a method for a construction of a contrast from temperature maps acquired using an exemplary MRI scanner apparatus according to an exemplary embodiment of the present disclosure.

FIG. 3 illustrates an exemplary flow diagram of an exemplary method, for determining tissue thermal properties. For example, at procedure 300, a patient or a phantom can be positioned or placed inside of an MRI scanner. The temperature distribution of the tissue of the person or phantom can be perturbed at procedure 305. At procedure 310, temperature screenshots, or maps, can be acquired during the time at which the temperature can be perturbed (e.g., a period during which the beat distribution can change over time), using the MRI scanner. The temperature variation can be acquired for each pixel or voxel of the patient or phantom that is being imaged. Further, at procedure 315, temperature maps from the MRI scanner can be input into an exemplary algorithm/procedure, which can construct and/or reconstruct any one of three exemplary contrasts, or images, (e.g., $$\frac{k}{c\rho}$$

at procedure 330, $$\frac{w}{c\rho}$$

at procedure 325 and/or $$\frac{Q}{c\rho} \text{ or } \frac{Q}{c\rho} + \frac{SAR}{c}$$

at procedure 320), and which can be based on an exemplary least squares solution to the bio-heat equation. The images constructed and/or generated for each contrast can contain information about each pixel or voxel of the patient or phantom that is being imaged. Additionally, the value for each contrast at each pixel or voxel can be based on neighboring pixels or voxels (e.g., 7 neighbor voxels for a single voxel).

$$\frac{k}{c\rho},$$

which can be measured in units of m$^2$/s, can be referred to as "heat diffusivity."

$$\frac{w}{c\rho},$$

which can be measured in units of mL-m$^3$-C)/(100 g-min-J), can be measured in conjunction with the perfusion of tissue w, heat capacity c and the density of the tissue $\rho$.

$$\frac{Q}{c\rho},$$

which, can be measured in units of c/s, can be the ratio of the metabolic energy term Q over heat capacity c and tissue density $\rho$.

$$\frac{Q}{c\rho} + \frac{SAR}{c}$$

can be the ratio of the metabolic energy Q over the heat capacity c and tissue density $\rho$, with the addition of SAR over the heat capacity c.

The exemplary procedure, can described herein with reference to FIG. 3, can utilized during a cooling or heating period of the tissue. For example, a RF coil can be used to radiate the tissue in order to heat the tissue. During this exemplary heating process, information about the temperature distribution (e.g., screenshots) can be taken and used for the inversion of the bioheat equation.

Figure 4:
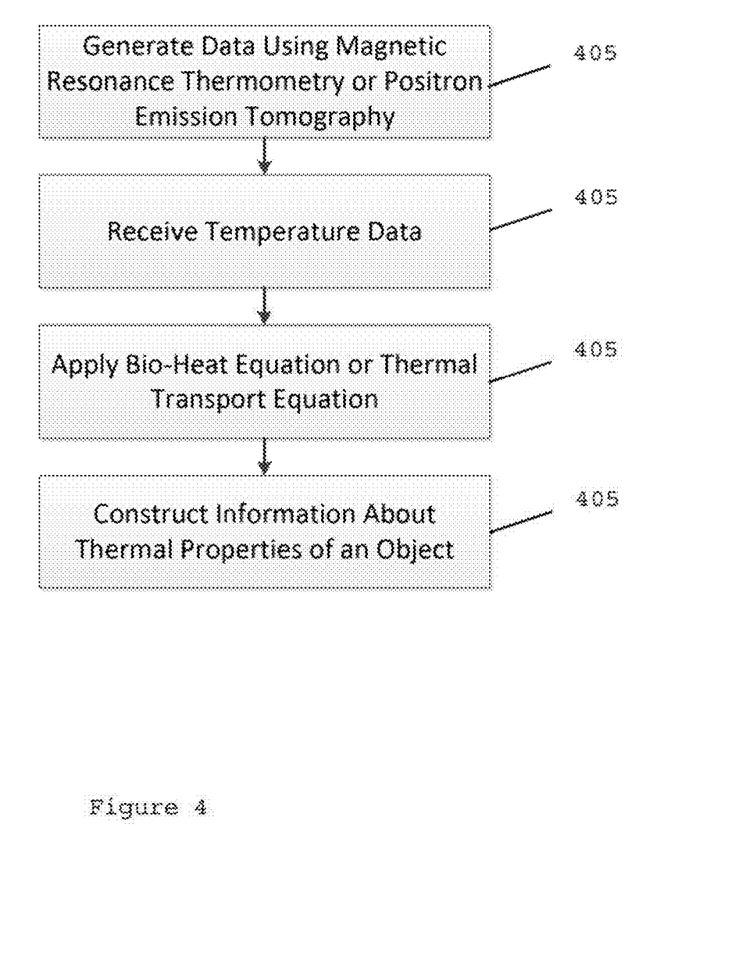
FIG. 4 is an exemplary flow diagram illustrating a method for generating information about the thermal properties of an object according to an exemplary embodiment of the present disclosure.

FIG. 4 shows an exemplary flow diagram illustrating a method for generating information about the thermal properties of an object. At procedure 405, data can be generated using Magnetic Resonance Thermometry or Positron Emission Tomography. The generated data, which can be related to the temperature of the object at multiple points in time and space can be received at procedure 410. The temperature can relate to the heating and/or the cooling of the object. At procedure 415, a bio-heat equation or a thermal transport equation can be applied to the temperature data. At procedure 420, information about the thermal properties of the object can be generated.

Exemplary Discussion and Conclusion

The exemplary system, method, and computer-accessible medium according to an exemplary embodiment of the present disclosure, can facilitate a construction and/or reconstruction of tissue thermal properties based on progressive MR-based temperature measurements. In contrast to LMT, where incomplete measurements of RF magnetic fields require supplementing the set of electrical property unknowns with unknowns such as the absolute RF reference phase, the exemplary system, method and computer-accessible medium, according to an exemplary embodiment of the present disclosure, can provide all the interior measurements necessary to invert the discretized bioheat equation (see, e.g., Equation 1), which can describe the response of the system to thermal perturbation.

Figure 5:
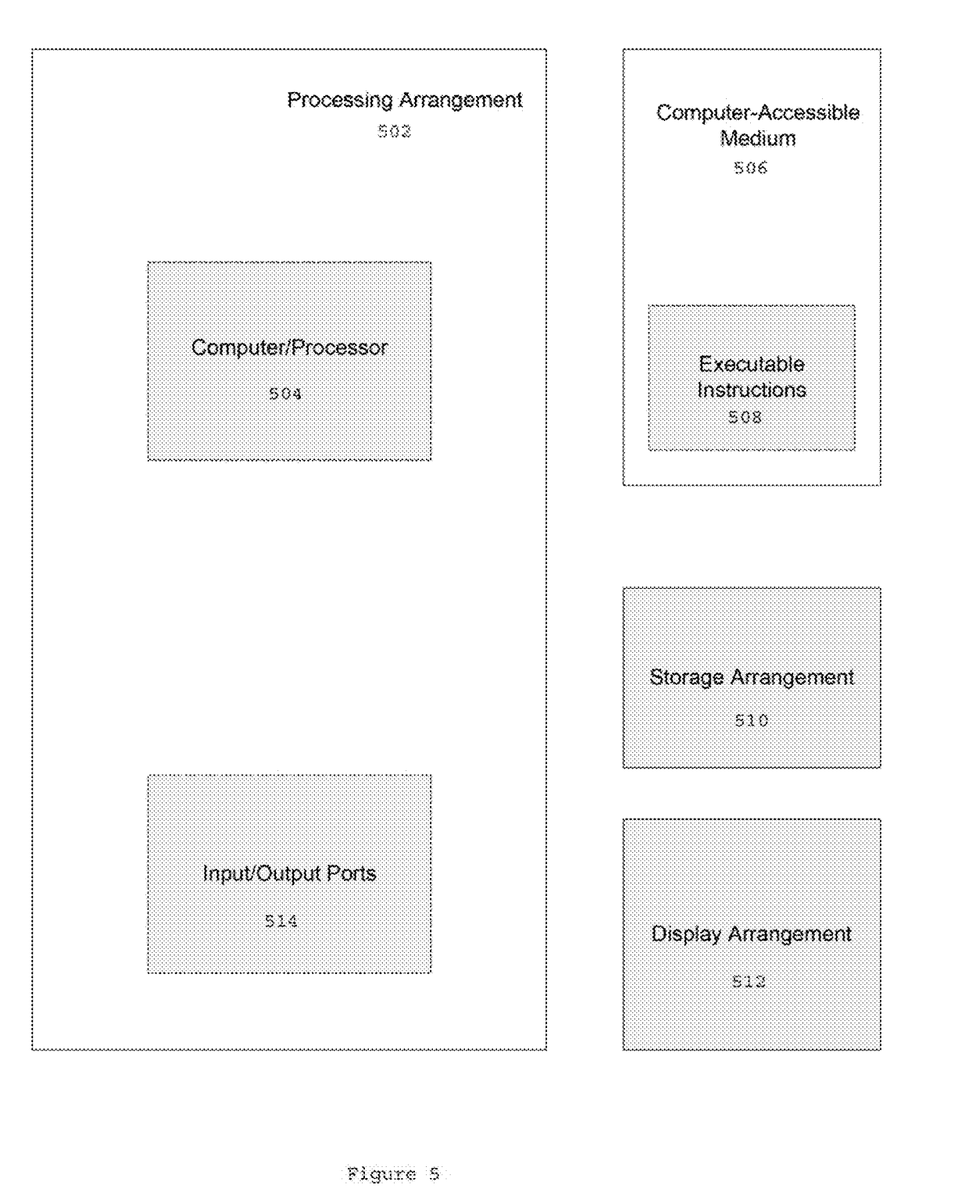
FIG. 5 is an illustration of an exemplary block diagram of an exemplary system in accordance with certain exemplary embodiments of the present disclosure.

FIG. 5 shows a block diagram of an exemplary embodiment of a system according to the present disclosure. For example, exemplary procedures in accordance with the present disclosure described herein can be performed by a processing arrangement and/or a computing arrangement 502. Such processing/computing arrangement 502 can be, e.g., entirely or a part of, or include, but not limited to, a computer/processor 504 that can include, e.g., one or more microprocessors, and use instructions stored on a computer-accessible medium (e.g., RAM, ROM, hard drive, or other storage device).

As shown in FIG. 5, e.g., a computer-accessible medium 506 (e.g., as described herein above, a storage device such as a hard disk, floppy disk, memory stick, CD-ROM, RAM, ROM, etc., or a collection thereof) can be provided (e.g., in communication with the processing arrangement 502). The computer-accessible medium 506 can contain executable instructions 508 thereon. In addition or alternatively, a storage arrangement 510 can be provided separately from the computer-accessible medium 506, which can provide the instructions to the processing arrangement 502 so as to configure the processing arrangement to execute certain exemplary procedures, processes and methods, as described herein above, for example.

Further, the exemplary processing arrangement 502 can be provided with or include an input/output arrangement 514, which can include, e.g., a wired network, a wireless network, the internet, an intranet, a data collection probe, a sensor, etc. As shown in FIG. 5, the exemplary processing arrangement 502 can be in communication with an exemplary display arrangement 512, which, according to certain exemplary embodiments of the present disclosure, can be a touch-screen configured for inputting information to the processing arrangement in addition to outputting information from the processing arrangement, for example. Further, the exemplary display 512 and/or a storage arrangement 510 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY PUBLICATIONS

The following publications are hereby incorporated by reference in their entireties.

[1] Katchser, U. et al., IEEE Trans Med Imaging 2003, Volume 28, page 1365 (2009).
[2] Sodickson, D. K. et al., ISMRM, page 387 (2012).
[3] Pennes, H. H., Journal Applied Physiology, pages 93-122 (1948).
[4] Collins, C. M. et al., JMRU, Colume 19 pages 650-656 (2004).
[5] Cao, Z. et al., ISMRM, page 312 (2012).

What is claimed is:

1. A non-transitory computer-accessible medium having stored thereon computer-executable instructions for constructing information regarding a distribution of thermal properties of at least one object, wherein, when a computer hardware arrangement executes the instructions, the computer arrangement is configured to perform procedures comprising:
   receiving data related to a temperature of the at least one object acquired at multiple points in time and space at which at least one portion of the at least one object is at least one of heated or cooled, wherein the data is based on progressive temperature measurements of the at least one portion of the at least one object; and
   constructing the information using the data based on at least one of a bio-heat equation or a thermal transport equation by measuring spatial and temporal variations in the temperature measurements as the at least one object is at least one of heated or cooled.

2. The non-transitory computer-accessible medium according to claim 1, wherein the bio-heat equation is a Pennes' bio-heat equation.

3. The non-transitory computer-accessible medium according to claim 1, wherein the computer arrangement is further configured to generate the data relating to the temperature using at least one of a magnetic resonance thermometry or a positron emission tomography.

4. The non-transitory computer-accessible medium according to claim 1, wherein the data relating to the temperature includes information regarding at least one of a pixel or a voxel associated with an image of the at least one object.

5. The non-transitory computer-accessible medium according to claim 2, wherein the construction procedure includes inverting the Pennes' bio-heat equation.

6. The non-transitory computer-accessible medium according to claim 1, wherein the computer arrangement is configured to discretize the bio-heat equation in space and time.

7. The non-transitory computer-accessible medium according to claim 1, wherein the computer arrangement is configured to discretize the bio-heat equation in a matrix form, and wherein at least one of rows or columns of the matrix correspond to different acquisition times of spatial variations of the temperature data.

8. The non-transitory computer-accessible medium of according to claim 7, wherein the matrix has a form of $$\begin{bmatrix} T_2 & \cdots & T_1 \\ \vdots & & \vdots \\ T_n & \cdots & T_{n-1} \end{bmatrix} = \begin{bmatrix} \nabla^2 T_1 dt & \rho_{blood} c_{blood}(T_1 - T_{core})dt & dt \\ \vdots & \vdots & \vdots \\ \nabla^2 T_{n-1} dt & \rho_{blood} c_{blood}(T_{n-1} - T_{core})dt & dt \end{bmatrix} \begin{bmatrix} \frac{k}{\rho c} \\ \frac{w}{\rho c} \\ \frac{Q_m}{\rho c} \end{bmatrix},$$

where T is a temperature of the at least one object, k is heat diffusivity of the at least one object, ρ is a density of the at least one object, c is a heat capacity of the at least one object, w is perfusion of the at least one object, and Q is metabolic energy of the at least one object.

9. The non-transitory computer-accessible medium according to claim 1, wherein the information relates to a heat diffusivity of the at least one object.

10. The non-transitory computer-accessible medium according to claim 9, wherein the heat diffusivity is based on $$\frac{k}{c\rho},$$

wherein k is a heat conduction of the at least on object, c is a heat capacity of the at least one object, and ρ is a density of the at least one object.

11. The non-transitory computer-accessible medium according to claim 1, wherein the information relates to perfusion of the at least one object.

12. The non-transitory computer-accessible medium according to claim 11, wherein the perfusion is based on $$\frac{w}{c\rho},$$

wherein w is a perfusion of the at least on object, c is a heat capacity of the at least one object, and ρ is a density of the at least one object.

13. The non-transitory computer-accessible medium according to claim 1, wherein the information relates to a metabolic energy of the at least one object.

14. The non-transitory computer-accessible medium according to claim 13, wherein the metabolic energy is based on $$\frac{Q}{c\rho},$$

where Q is metabolic energy of the at least on object, c is a heat capacity of the at least one object, and ρ is a density of the at least one object.

15. The non-transitory computer-accessible medium according to claim 1, wherein the at least one object includes an anatomical structure.

16. The non-transitory computer-accessible medium according to claim 15, wherein the anatomical structure is at least one of fat, muscle, or cerebellum.

17. The non-transitory computer-accessible medium according to claim 1, wherein the information is at least one of two-dimensional information, three-dimensional information, or four-dimensional information.

18. The non-transitory computer-accessible medium according to claim 1, wherein the information relates to at least one of (i) a time invariant perfusion, (ii) a time invariant metabolic energy, or (iii) a time invariant heat diffusivity.

19. A system for constructing information regarding a distribution of thermal properties of at least one object, comprising:
a computer hardware arrangement configured to:
a) receive data related to a temperature of the at least one object acquired at multiple points in time and space at which at least one portion of the at least one object is at least one of heated or cooled, wherein the data is based on progressive temperature measurements of the at least one portion of the at least one object; and
b) construct the information using the data based on at least one of a bio-heat equation or a thermal transport equation by measuring spatial and temporal variations in the temperature measurements as the at least one object is at least one of heated or cooled.

20. A method for constructing information regarding a distribution, of thermal properties of at least one object, comprising:
receiving data related to a temperature of the at least one object acquired at multiple points in time and space at which at least one portion of the at least one object is at least one of heated or cooled, wherein the data is based on progressive temperature measurements of the at least one portion of the at least one object; and
using a computer hardware arrangement, constructing the information using the data based on at least one of a bio-heat equation or a thermal transport equation by measuring spatial and temporal variations in the temperature measurements as the at least one object is at least one of heated or cooled.

* * * * *